Jan. 2, 1968 J. E. THORPE ET AL 3,361,063

PRINTING PLATES

Filed Feb. 11, 1966

INVENTORS
John Edwin Thorpe,
& Charles Sampson
BY
Lane, Aitken, Dunner & Ziems
ATTORNEYS United States Patent Office 3,361,063

Patented Jan. 2, 1968

3,361,063

PRINTING PLATES

John Edwin Thorpe, Sunninghill, and Charles Sampson, London, England, assignors to Circuit Foil Corporation, Bordentown, N.J., a corporation of New Jersey Filed Feb. 11, 1966, Ser. No. 526,817
3 Claims. (Cl. 101—395)

This invention relates to printing plates and methods for their manufacture and, more particularly, to printing plates having particular utility in rotary letterpress printing or indirect letterpress printing (dry offset) and to methods for their manufacture.

It is known to manufacture flexible printing plates comprised of a laminate of an etchable metal, suitable for etching to give a surface from which a print can be taken, a flexible backing material to provide a support for the printing surface. Such printing plates are particularly effective for rotary letterpress printing applications or indirect letterpress printing (dry offset) and have in recent years come into widespread use.

In the manufacture of the desired printing plate from a blank formed as described above, selected portions of the top layer of etchable metal are etched away with an appropriate etching agent after treating such metal in a conventional manner (such as by a photographic technique) to define the portions to be removed. In the course of the etching process, extreme care must be taken to avoid damage to the flexible support layer through etching to too great an extent (as a result of which the etchant will eat right through to and including the support layer) when using an etchant which is corrosive to such support layer. This difficulty inherently increases the cost of manufacture of such printing plates and results in much wastage.

In accordance with the present invention, a technique has been developed to eliminate the difficulties involved in the fabrication of flexible printing plates and to provide a resulting plate which is extremely inexpensive to manufacture.

It is accordingly an important object of the present invention to provide a novel printing plate and method for its manufacture which eliminates manufacturing problems conventionally encountered with presently known etching techniques.

It is a further important object of the present invention to provide a novel printing plate formed of at least two metal layers both of which are susceptible to attack by an etchant to be used in the etching process and which are bonded together by an adhesive which is resistant to attack by said etchant so as to provide a barrier or stop preventing said etchant from eating through to the one of said metal layers serving as a support.

Figure 1:
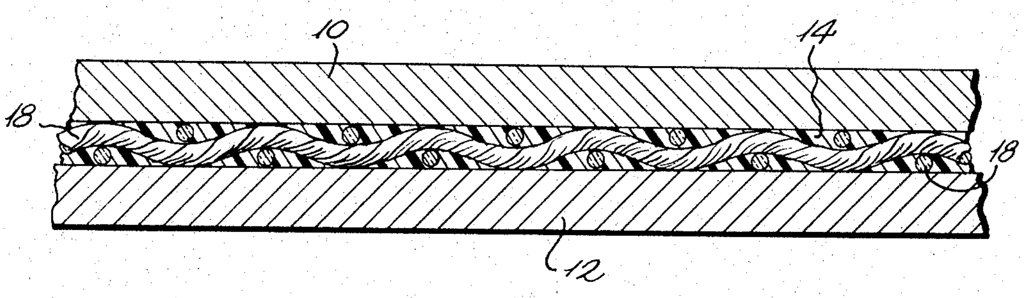
Figure 2:
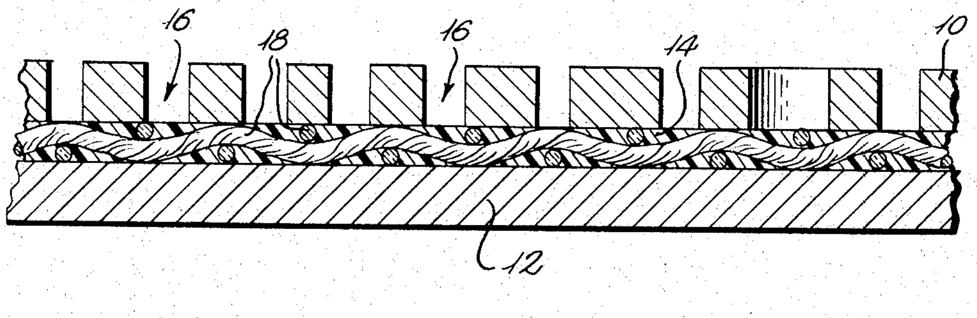

These and other important objects and advantages of the present invention will become more apparent by reference to the ensuing description and claims and drawings wherein:

FIG. 1 is a vertical sectional view taken through a blank laminate adapted to be treated with an etchant to form a printing plate; and FIG. 2 is a vertical section through a printing plate of the type shown in FIG. 1 following the treatment of one of the metal layers of said printing plate with an etchant to define a printing surface.

As previously indicated and as may best be seen by reference to FIGS. 1 and 2, the novel printing plate of the present invention is comprised of a lamination of two metal layers, a first layer 10 formed from an etchable metal which is adapted to be etched to form a printing surface and a second metal layer 12 provided to serve as a backing or carrier layer, said metal layers being bonded together with an adhesive 14 which is not attacked by the etchant used to etch away the printing layer 10.

The two layers of metal may be of the same or different materials, the important consideration being that each of said layers is formed of a metal which is susceptible to attack by the etchant to be used to etch away the defined portions of printing layer 10. Examples of suitable materials for use as the printing layer 10 are copper, zinc, magnesium, chromium, cadmium, brass or the like. Examples of the backing or support layer 12 are metals such as copper, aluminum, steel or the like.

The printing layer 10 should be of a thickness from approximately .005 to .020 inch, the particular choice of thickness being dependent upon the amount of relief required for the particular application in question. The backing or support layer 12 should preferably be not less than one-half or more than one and one-half times the thickness of the printing layer 10.

The adhesive 14 may be selected from any of the conventional liquid adhesives provided only that it is resistant to the particular etchant used to etch away the defined portions of printing layer 10 (such etched portions being indicated generally by the number 16 in FIG. 2). In a preferred embodiment of the present invention, such adhesive encapsulates a single layer of woven glass cloth (indicated at 18 in the drawings) which serves to control the thickness of the adhesive layer and also increases the strength of the base.

When the copper is used as one of the metals in the printing plate of the present invention, the adhesive used should be resistant to ferric chloride and ammonium persulfate, which are commonly used as etchants in the case of a copper printing surface. When zinc or chromium form the printing surface, the adhesive should be resistant to hydrochloric acid. Those skilled in the art will have no difficulty selecting a particular adhesive for the purpose in question depending upon the etchant used and the metals forming the printing plate.

Merely by way of example, an excellent adhesive which is resistant to all of the etchants mentioned above is an epoxy resin formed from 55 parts by weight of Versamid 125 and 45 parts by weight of Gen Epoxy 190. These materials are thoroughly stirred together until solution is completed. The metals to be joined together are properly coated with the resin and placed in a hydraulic press where they are subjected to suitable conditions of pressure and temperature until the resin is cured. For example, if a .014" copper lamina is to be bonded to another copper lamina of equal thickness the sandwich of the two copper lamina containing the epoxy adhesive between them can be subjected in a hydraulic press to a pressure of 25 p.s.i., at 300° F. for 10 minutes. The resulting bond strength of the laminate will be about 12 lbs. per inch. A similar adhesive formulation when used to bond .014" copper to .011" steel and subject to the same hydraulic conditions results in a bond strength in the laminate of about 8 lbs. per inch. [Note: Versamid and Gen Epoxy are trade names for products of the General Mills Company of Illinois. Versamid 125 is a polyamide resin with an amine value of 345, amine value being the milligrams of potassium hydroxide equivalent to the amine alkalinity present in one gram of sample as determined by non-aqueous, potentiometric titration. Gen Epoxy 190 is considered to be a pure epoxy resin.]

If desired, the exposed surface of the backing or support metal layer 12 may be protected with a non-etchable plastic layer or another nonetchable metal layer to protect such layer during processing.

An advantage of the printing plate of the present invention is that in etching the printing layer 10, defined portions of such printing layer may be removed down to the adhesive 14 at the interface between the metal layers 10 and 12, such adhesive accordingly serving as a positive stop to the etching process. This serves to prevent uneven etching which would otherwise result in a defective printing plate. In order to insure the necessary curvature on bending the etched plate for use in connection with a rotary press, the total thickness of the plate material is preferably .0125–.025 inch.

The invention may be embodied in other specific forms without departing from the spirit or essential characteristics thereof. The present embodiments are therefore to be considered in all respects as illustrative and not restrictive, the scope of the invention being indicated by the appended claims rather than by the foreging description, and all changes which come within the meaning and range of equivalency of the claims are therefore intended to be embraced therein.

The invention claimed is:

1. A printing plate comprised of at least two metal layers bonded together with an adhesive; said metal layers both being susceptible of being attacked by a predetermined etchant; said adhesive being of a material which is resistant to attack by a said etchant; said adhesive encaspulating at least one layer of woven glass cloth to provide an adhesive layer of substantially uniform thickness; and selected portions of one of said metal layers being removed to define a printing surface; the thickness of said one metal layer being about .005 to about .020 inch; the thickness of the other metal layer being from about ½ to 1½ times the thickness of said one metal layer.

2. A printing plate as defined in claim 1 wherein said adhesive is an epoxy resin.

3. A printing plate as defined in claim 1 wherein said metal layers are formed of different metals.

References Cited

UNITED STATES PATENTS

| | | | |
|---|---|---|---|
| 2,257,143 | 9/1941 | Wood. | |
| 2,258,520 | 10/1941 | Somers | 101—401.1 |
| 2,839,480 | 6/1958 | Ott et al. | |

FOREIGN PATENTS

| | | |
|---|---|---|
| 383,259 | 2/1931 | Great Britain. |
| 470,402 | 8/1937 | Great Britain. |
| 597,720 | 2/1948 | Great Britain. |
| 659,766 | 10/1951 | Great Britain. |

ROBERT E. PULFREY, *Primary Examiner.*

J. A. BELL, *Assistant Examiner.*